United States Patent

Yu

[11] Patent Number: 6,030,569
[45] Date of Patent: Feb. 29, 2000

[54] PACKAGING PROCESS USING A WEDGE DEVICE FOR LINEAR FORCE AMPLIFICATION IN A PRESS

[75] Inventor: Qiang Yu, Singapore, Singapore

[73] Assignee: Advanced Systems Automation Limited, Singapore, Singapore

[21] Appl. No.: 08/879,227

[22] Filed: Jun. 19, 1997

[30] Foreign Application Priority Data

Jun. 21, 1996 [SG] Singapore ............................ 9610127-4

[51] Int. Cl.[7] ........................ B29C 70/70; B29C 33/20
[52] U.S. Cl. .............................. 264/272.17; 425/451.7; 425/DIG. 129
[58] Field of Search .................................. 425/169, 170, 425/451.7, DIG. 129, 595; 100/291; 264/272.17, 272.15, 319, 272.11

[56] References Cited

U.S. PATENT DOCUMENTS

| | | | |
|---|---|---|---|
| 2,370,622 | 3/1945 | Gastrow | 425/451.7 |
| 3,122,033 | 2/1964 | Riemenschneider et al. | 100/291 |
| 3,139,816 | 7/1964 | Jemison et al. | 100/291 |
| 3,327,353 | 6/1967 | Eggenberger | 425/451.7 |
| 3,743,469 | 7/1973 | Gibbons | 425/451.7 |
| 3,765,812 | 10/1973 | Sugiyama | 425/451.7 |
| 3,874,218 | 4/1975 | Bachman | 100/291 |
| 3,922,920 | 12/1975 | Bachman | 100/291 |
| 4,462,291 | 7/1984 | Schulz | 100/291 |
| 4,535,689 | 8/1985 | Putkowski | 425/451.7 |
| 4,615,857 | 10/1986 | Baird | 264/272.17 |
| 4,768,946 | 9/1988 | Maruyama et al. | 425/451.7 |
| 4,938,682 | 7/1990 | Kadoriku et al. | 425/451.7 |
| 5,252,053 | 10/1993 | Schraven et al. | 425/127 |
| 5,366,364 | 11/1994 | Tanaka et al. | 425/116 |
| 5,397,528 | 3/1995 | Schraven et al. | 264/328.1 |
| 5,622,737 | 4/1997 | Hehl | 425/451.7 |
| 5,662,848 | 9/1997 | Tanaka et al. | 264/102 |

*Primary Examiner*—Angela Ortiz
*Attorney, Agent, or Firm*—Lawrence Y. D. Ho; David D. Chung; Jacqueline C. T. Lui

[57] ABSTRACT

A wedge device for a press for controllably exerting high amounts of force in a clamping operation during a semiconductor packaging process and for facilitating a linear force output in relation to its input. The wedge device is powered by a servo motor which is coupled to a planetary screw by a set of pulleys and a timing belt. The screw is mated with a nut which is prevented from rotating so that the rotation of the screw causes the nut to move in a linear direction. Metal extensions join the nut to a bottom wedge such that the wedge moves together with the nut. Slidably disposed on top of the bottom wedge is a block bearing firmly attached to a complementary wedge. The complementary wedge is free to move in a vertical direction but not in a horizontal direction. As the bottom wedge moves in a horizontal direction, the complementary wedge moves in a vertical direction. The complementary wedge is placed underneath a press to provide the clamping force necessary for a semiconductor packaging operation.

18 Claims, 4 Drawing Sheets

PACKAGING PROCESS USING A WEDGE DEVICE FOR LINEAR FORCE AMPLIFICATION IN A PRESS

FIELD OF THE INVENTION

This invention relates to the field of semiconductor packaging, and in particular to a wedge device for a press which can controllably exert high amounts of force in a clamping operation during a semiconductor packaging process and to facilitate linear force output in relation to its input.

BACKGROUND OF THE INVENTION

Clamping operation is crucial in the semiconductor packaging industry for securing a pre-form in between moulds before resin compound is delivered thereto to encapsulate a semiconductor device. Good control over the clamping operation is important to ensure that the pre-forms are not scratched or damaged during the clamping operation and that sufficient clamping force is applied to minimize leakage of the resins during the moulding operations of the packaging process.

Variety of mechanical devices have been used and proposed to improve the control of the application of force. Because the required clamping force is high, i.e., about 60 tons, and the tolerance is relatively small, i.e., a few tons, the clamping mechanism must be capable of exerting extremely high force and with high degree of accuracy. Currently, a popular choice is to use a hydraulic-type of a press. Hydraulics is a good choice for this type of operation as the force output is substantially linear to the input. This allows the operator to more easily and accurately apply the right amount force needed for the operation. Furthermore, hydraulic systems are able to exert high amounts of force.

However, hydraulic systems suffer from a number of shortcomings, particularly in light of the clean-room environment in which semiconductor packaging processes are often operated under. Hydraulics systems by its physical nature, requires the use a fluid. A common fluid currently used is a kind of oil. When exerting high amounts of force, and particularly in a continuous and repeated manner, the fluid and its fumes have the tendency to leak out the system. This leakage, while may not be a significant in an industry such as automobile repair, can be a serious problem in the semiconductor packaging industry where cleanliness is a high priority. In addition, hydraulic systems often involve complex parts and mechanisms which need precision in mating, and which need relatively high maintenance.

Although there exist other means for exerting high amounts of force, e.g., pneumatic or electromechanical presses with toggle mechanism, these systems are not ideally suited for clamping operations in semiconductor packaging. Some exemplary shortcomings include, among others, inability to exert high amounts of force; lack of control, accuracy, or precision; non-linear relationship between input and output; complex parts or mechanisms; high need for maintenance; excessive friction between parts; inefficiency; slow operations; etc. Therefore, in light of the shortcomings stated above, there is a need for a new type of force-exerting device which can controllably deliver high amounts of force without compromising the cleanliness of the environment which it is operated under, and which avoids complex mechanisms or high maintenance.

OBJECT OF THE INVENTION

It is therefore, the object of the present invention to provide an apparatus to overcome the shortcomings stated above, and to utilize a simple, efficient mechanism for precisely delivering high amounts of force suitable for clamping operations in semiconductor packaging processes.

SUMMARY OF THE INVENTION

The present invention solves the problems stated above by providing a simple mechanism which can controllably exert high amounts of force without detrimentally affecting the clean-room environment. The wedge device is powered by a servo motor which is coupled to a planetary screw by a set of pulleys and a timing belt. The screw is mated with a nut which is prevented from rotating so that the rotation of the screw causes the nut to move in a linear direction. A metal extension joins the nut to a bottom wedge such that the wedge moves together with the nut. Slidably disposed on top of the bottom wedge is a block bearing firmly attached to a complementary wedge. The complementary wedge is left to move in a vertical direction but not in a horizontal direction. As the bottom wedge moves in a horizontal direction, the bottom moves in a vertical direction. The complementary wedge is placed underneath a press to provide the clamping force necessary for a semiconductor packaging operation. In an alternative embodiment of the present invention, the block bearing is replaced with caged rollers.

BRIEF DESCRIPTION OF THE DRAWINGS

FIG. 1A is an isolated plan view of the complementary wedge with the cam follower.

FIG. 1B is a schematic diagram of the caged rollers and their interaction with the wedge.

DETAILED DESCRIPTION OF THE INVENTION

The present invention is a wedge device for a press which amplifies force by a mechanical means. It is particularly suited for semiconductor packaging processes as the output force bears a linear relationship with the input force to allow high level of control of the force output, which is a necessary condition in semiconductor packaging operations. In addition, unlike a hydraulics mechanism, the present invention does not utilize any fluids to amplify the force. Therefore, it is highly adaptable for semiconductor packaging applications performed in a clean room environment because there is no worry of leakage or other fluid-related problems which may contaminate the environment. Furthermore, because the present invention can be built using many of the standard components and custom components which are easy to fabricate, it is facilitates virtually maintenance-free operation and rapid production.

Figure 1:
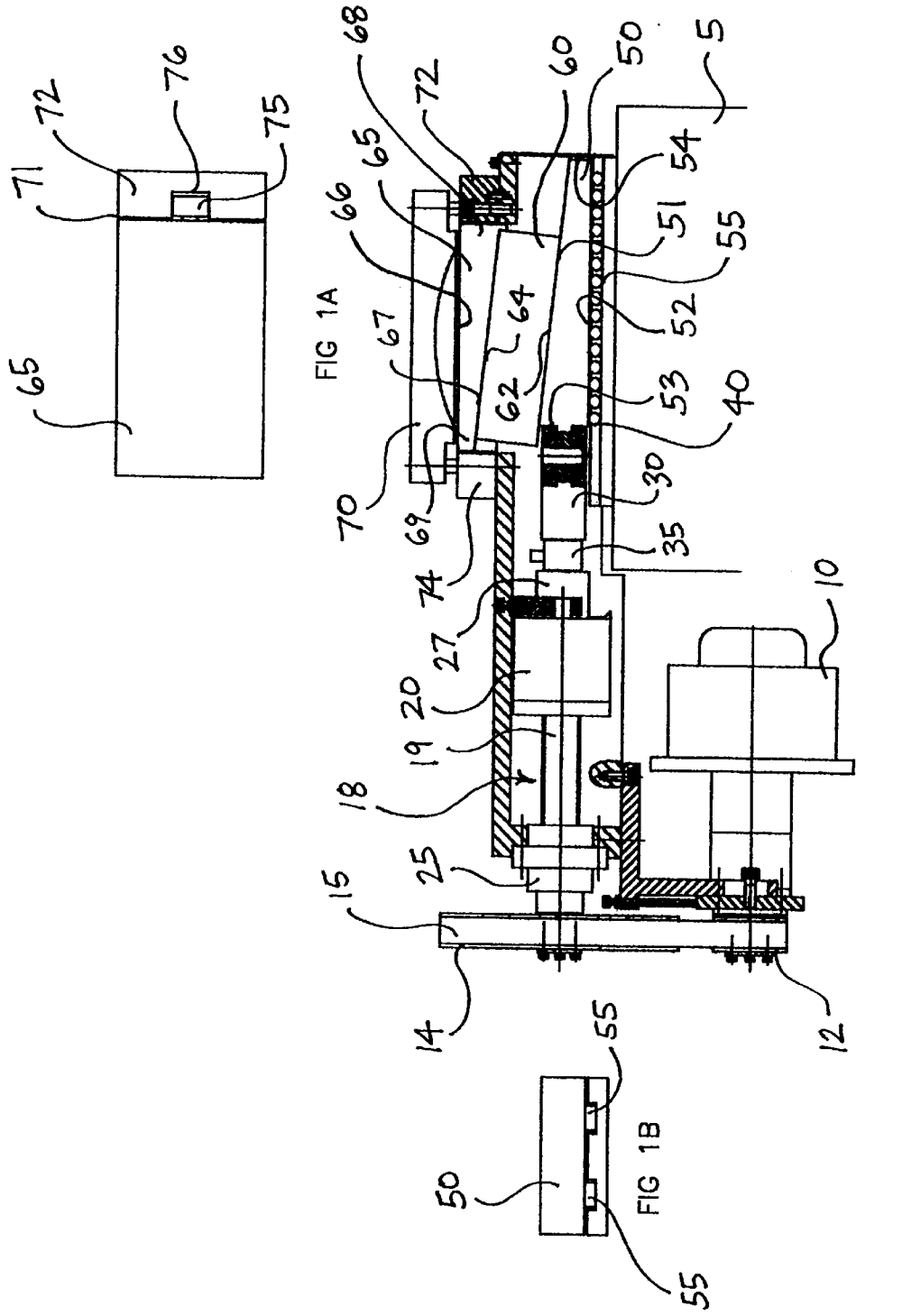
FIG. 1 is an illustration of the side view of the present invention.

FIG. 1 illustrates the preferred embodiment of the wedge device 1. The device includes a base 5 which provides a stable foundation for the press. Because the wedge device can exert over 60 tons of force, the base should be strong enough to withstand forces well beyond this range. The press is driven by a servo motor 10 which is the source of power for the device. Because the desired movement is linear, the a mechanism is needed to convert the rotational movement of the motor to a linear movement. This conversion is achieved by strapping a timing belt 15 onto a pulley 12 of the motor 10 and the pulley 14 of the linear-conversion mechanism 18. The pulley 14 has a greater diameter than the pulley 12 to amplify the force generated by the servo motor 10. Although the timing belt 15 is preferably used in the present invention to achieve the necessary control, where such precise control is not needed, chains, gears or other connecting mechanism, can also be used.

The linear-conversion mechanism in FIG. 1 comprises a planetary screw 19 and a nut (not shown) which is encased in a housing 20. The planetary screw 19 is connected to the pulley 14 via a needle roller/cylindrical axle roller bearing assembly 25 such that the screw 19 rotates correspondingly with the movement of the belt 15. As the screw 19 rotates, the nut in housing 20 is prevented from rotating, and hence it moves translationally as its threading interacts with the threading of the screw 19. The nut in housing 20 is connected to the bottom wedge 50 by a metal extension 27 and 30, and the extension 30 is connected to the bottom wedge by a pin joint 40. In between the extension 27 and 30 is a pressure-sensitive load cell 35, a standard component in the industry which can be used to measure force. Due to the location of the load cell 35, it does not experience the total force amplification generated by the wedge device 1, and therefore, the force measured by the load cell 35 is much less than, but proportional to, the actual output force exerted by the wedge device. The actual force is calculated from the reading of the load cell measurements by a micro-controller (not shown) connected to the load cell 35 which takes into account the force amplification achieved by the wedge mechanism.

The bottom wedge 50 includes a sloping top 51, a bottom 52, a wide end 53, and a narrow end 54. Although here, the pin joint 40 is preferably connected to the wedge 50 at the wide end 53, it is also possible to connect to the narrow end 54, though this would require some adjustments in regard to the configuration of the complementary wedge 65. At the bottom 52 of the wedge 50 are caged rollers 55 which facilitate friction-reduced translational movement of the bottom wedge 50. Caged rollers are a commercially available product which comprise a set of rollers disposed in a solid support. FIG. 1B shows the front schematic view of the caged rollers and their interplay with the bottom wedge 50. It should be understood that while pre-fabricated caged rollers are preferred because of its ease of use, other types of rollers or friction-reducing devices can be used as well.

Slidably disposed on top 51 of the bottom wedge 50 is a block bearing 60 having a bottom surface 62 and a top surface 64. Disposed on the bottom surface 62 are rollers (not shown) for reducing friction between the bottom wedge 50 and the block bearing 60. Firmly attached to the top surface 64 of the block bearing 60 is the complementary wedge 65 having a top 66, a sloping bottom 67, a wide end 68, and a narrow end 69. The bottom wedge 50 and the complementary wedge 65 have complementary shapes such that the sloping bottom 67 of the complementary wedge 65 and the sloping top 51 of the bottom wedge 50 are approximately parallel to each other. Therefore, the bottom wedge bottom 52 and the complementary wedge top 66 are also substantially parallel to one another.

It should be understood by those skilled in the art that the block bearing 60 main function is to provide spacing between the bottom wedge 50 and the complementary wedge 65, and hence it can take on many forms. As a matter of convenience and manufacturability, the block bearing 60 can be purchased as a standard component in the industry and then be attached to the complementary wedge 65. In the alternative, the block bearing 60 and the complementary wedge 65 can be integrated with each other and be custom produced as a single component.

At each of the ends 68 and 69 of the complementary wedge 60 is a guide block 72 and 74 which are placed snugly around the complementary wedge 65. In between the guide blocks, 72 and 74, and the complementary wedge 65 is a friction-reducing material 71 such as a commercially available product Permalite™ strip, to reduce the sliding friction between the parts. The main function of the guide blocks 72 and 74 is to maintain a relatively straight vertical movement of the complementary wedge 65. To further guide the complementary wedge 65 and to prevent any rotational movement, a cam follower is attached to the complementary wedge 65, as shown in FIG. 1A. The cam follower 75 is basically a roller which is guided by the slot 76 disposed within the guide block 72.

Figure 2:
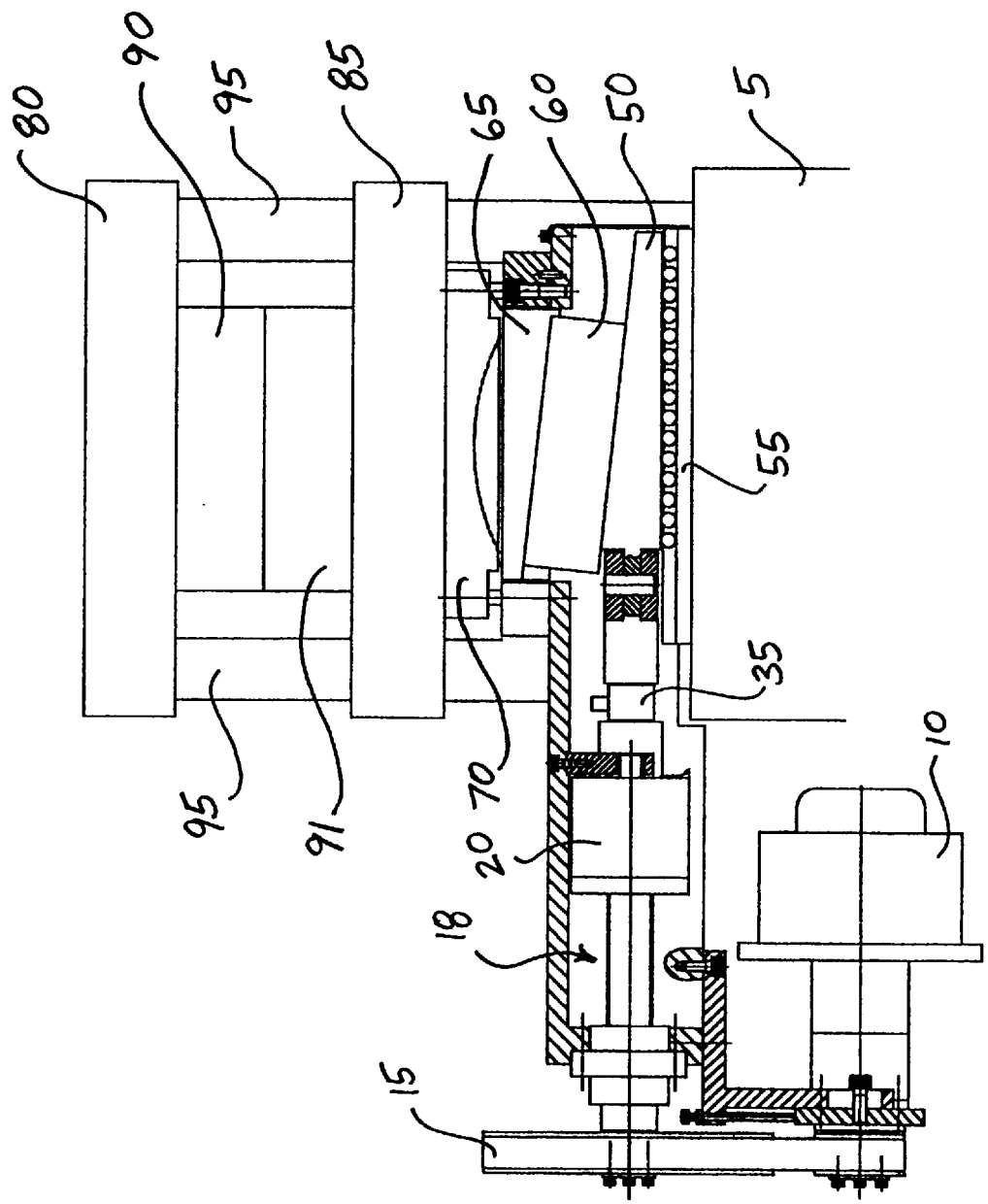
FIG. 2 is an illustration of the side view of the present invention interfacing with a clamping device for a semiconductor device.

On top of the complementary wedge 65 is a floating platen 70 which interfaces with a press or clamping device as shown in FIG. 2. Though this wedge device can be used to deliver force in many types of presses or clamping devices, it is preferred that it be implemented in the manner shown in FIG. 2. Here, the floating platen 70 rest immediately below the movable bottom platen 85. The bottom platen 85 is slidably engaged to the tie rods 95 such that it is able to move vertically in an up and down direction. A top platen 80 is fixedly disposed above the bottom platen 85 to provide support for the a clamping operation. In between the top 80 and bottom 85 platen are a top mould 90 and a bottom mold 91 which hold the semiconductor device in place during an encapsulation process.

Figure 3:
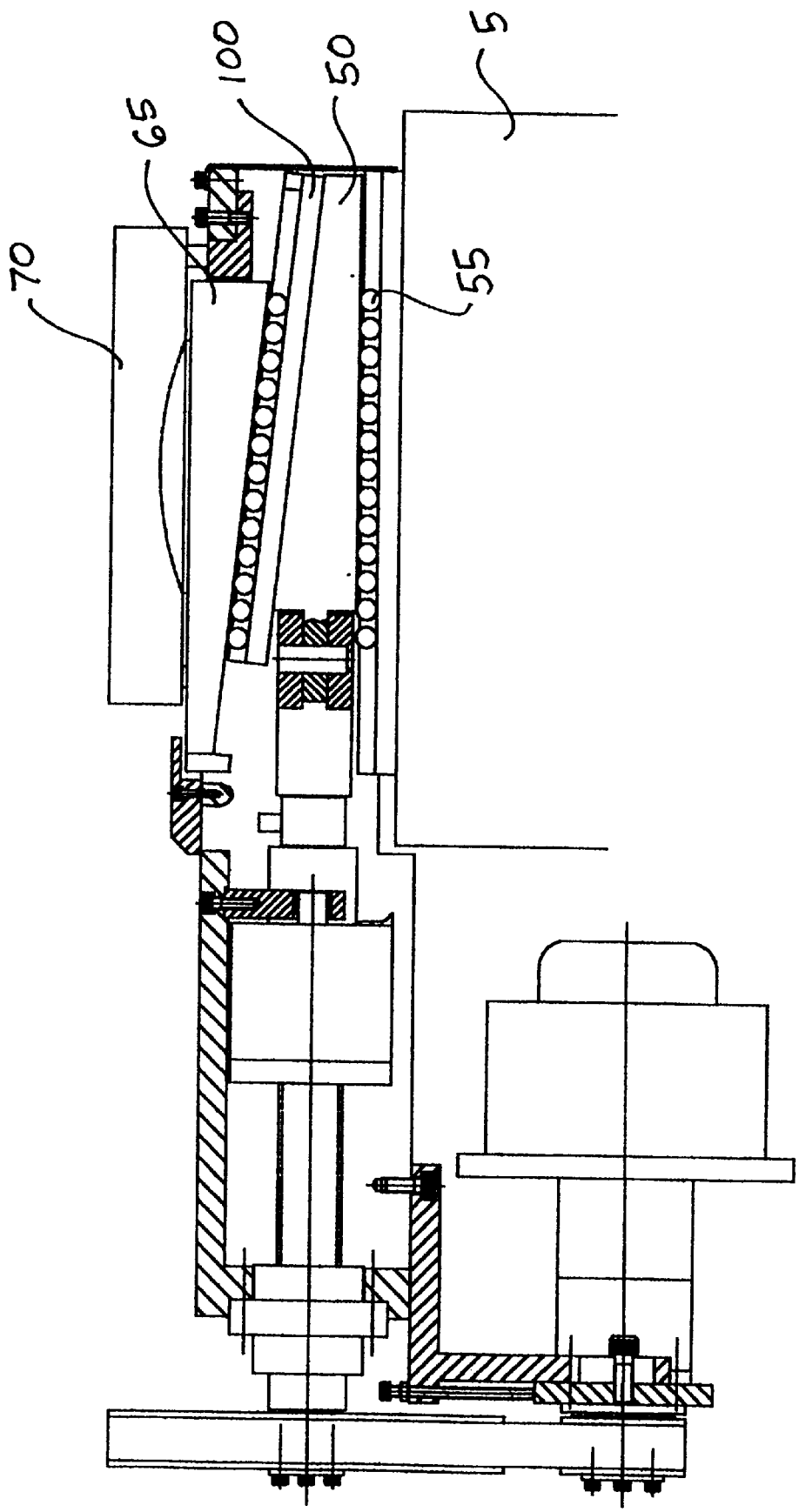
FIG. 3 is an illustration of the side view of an alternative embodiment of the present invention.

FIG. 3 is an alternative embodiment to the present invention. Many of the components from the preferred embodiment of FIG. 1 and their respective functions are duplicated in this embodiment, and so only the changes shall be described herein. In this embodiment, the block bearing 60 of the preferred embodiment as shown is FIG. 1 is replaced with caged rollers 100 which can be of the same type as the caged rollers 55. In this illustration, the caged rollers 100 are firmly attached to the bottom wedge 50, and they roll along the complementary wedge 65. It is also possible to place the rollers 100 upside down such that they are firmly attached to the complementary wedge 65, and roll along the top surface 51 of the bottom wedge 50.

Figure 4:
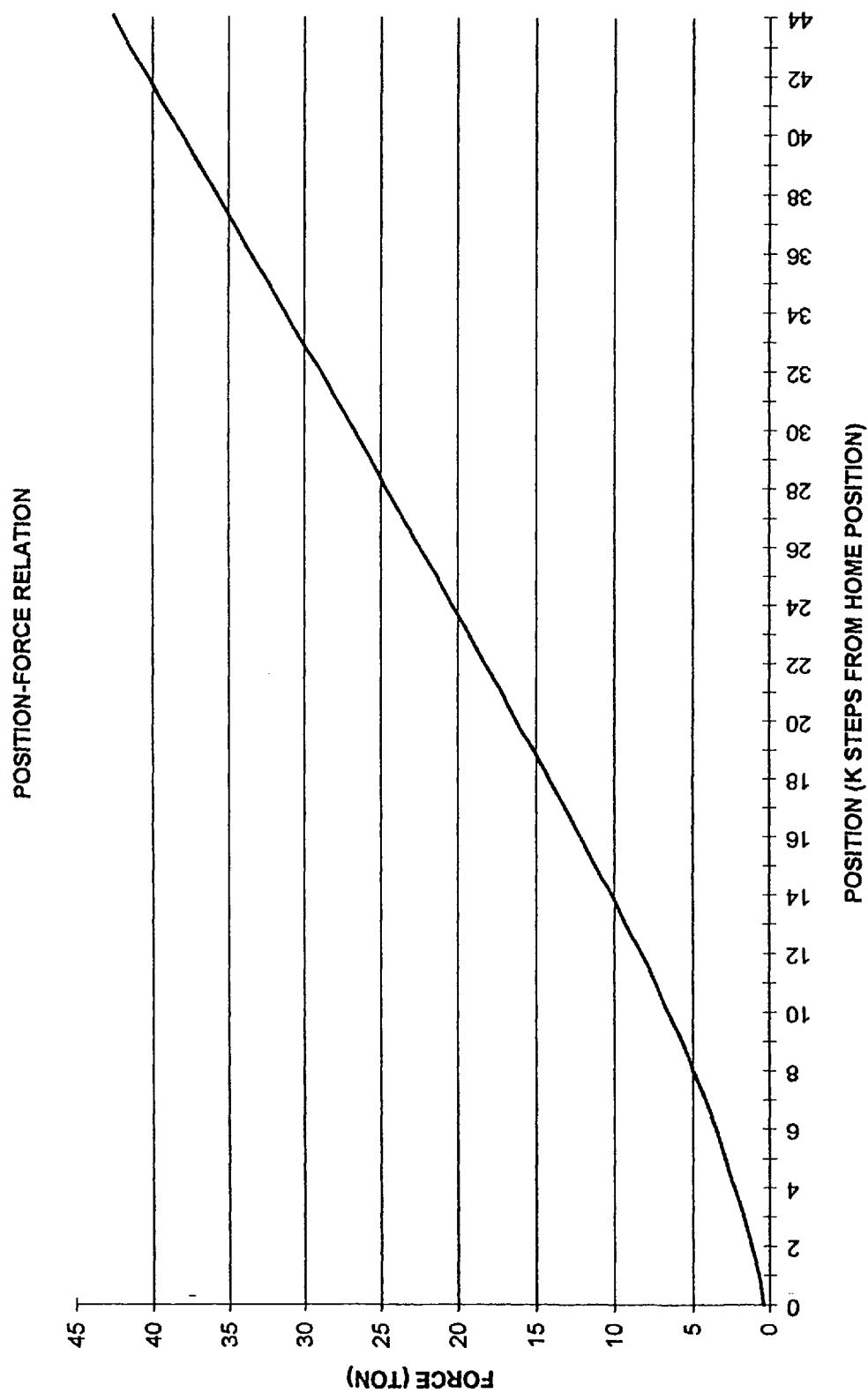
FIG. 4 is a graph illustrating the relationship between the output force of the present invention in relation to the input, the position of the servo motor as measured by the number of steps advanced from the home position.

FIG. 4 is a graph illustrating the relationship between the output force (measured in tons) of the wedge device and the input from the servo motor as measured in step displacement from the home position. The home position of 0 is defined to be approximately where the moulds 90 and 95 of the clamping device have just made contact and the wedge device is exerting near zero force. From this position, any turn from the servo motor increases the output force in linear relationship to the number of steps the motor has advanced from the home position as can be seen from FIG. 4. This relationship is particularly useful for a press being utilized for semiconductor packaging, as it allows the operator to precisely control the amount of force exerted during the clamping operation.

It should be understood by those skilled in the art that while the preferred and the alternate embodiments have been described here as way of fully disclosing a way to make and use the present invention, various modifications, additions and substitutions are possible for the embodiments without departing from the scope and spirit of the invention as disclosed in the accompanying claims.

We claim:

1. A method of facilitating a contamination-reduced semiconductor packaging operation on a semiconductor device comprising:
   providing a semiconductor moulding equipment having a top and bottom moulds in between top and bottom platens;
   placing the semiconductor device on the bottom mould;
   exerting a clamping force onto said bottom platen using a wedge device, said wedge device comprising,
      a servo motor;
      a linear-conversion mechanism mechanically coupled to said servo motor for converting a rotational movement to a linear movement;
         a bottom wedge firmly attached to said linear-conversion mechanisms, said wedge having a top, a bottom, a wide end and a narrow end;
         a base located below said bottom wedge;
         a first friction-reducing mechanism disposed between said bottom wedge and said base,
         a block bearing slidably disposed on the top of said bottom wedge;
         a second friction-reducing mechanism disposed between said block bearing and bottom wedge;
         a complementary wedge firmly attached to said block bearing, said complementary wedge being disposed under said bottom platen;
         a guide mechanism for guiding said complementary wedge;
   performing a semiconductor encapsulation operation;
   whereby a horizontal movement of said bottom wedge causes said complementary wedge and said bottom platen to move in a substantially vertical direction to clamp said bottom mould and said top mould, wherein a clamping force between said bottom mould and top mould is substantially linearly proportional to a step displacement of said servo motor, said wedge device facilitating a reduction in contamination.

2. The method as recited in claim 1 further comprising the step of placing said semiconductor moulding equipment in a room having a substantially clean-room environment.

3. The method as recited in claim 1 wherein said wedge device further comprises a load cell for measuring a force which is proportional to said output force.

4. The method as recited in claim 3 wherein said wedge device further comprises a micro-controller communicably connected to said load cell.

5. The method as recited in claim 1 wherein said block bearing and said complementary wedge are integrated into a single component.

6. The method as recited in claim 1 wherein said linear conversion means comprises a planetary screw and a nut.

7. The method as recited in claim 1 wherein said first friction-reducing means is caged rollers.

8. The method as recited in claim 1 wherein said second friction-reducing means is a set of rollers.

9. The method as recited in claim 1 wherein said wedge device further comprises a cam follower disposed on the complementary wedge.

10. A method of facilitating a contamination-reduced semiconductor packaging operation on a semiconductor device comprising:
    providing a semiconductor moulding equipment having a top and bottom moulds in between top and bottom platens;
    placing the semiconductor device on the bottom mould;
    exerting a clamping force onto said bottom platen using a wedge device, said wedge device comprising,
       a servo motor;
       a linear-conversion mechanism mechanically coupled to said motor for converting a rotational movement to a linear movement;
       a bottom wedge firmly attached to said linear-conversion mechanism, said wedge having a top, a bottom, a wide end and a narrow end;
       a base located below said bottom wedge;
       a first friction-reducing mechanism disposed between said bottom wedge and said base;
       a second friction-reducing mechanism disposed on top of said bottom wedge;
       a complementary wedge disposed on top of said second friction-reducing mechanism, said complementary wedge being disposed under said bottom platen;
       a guide mechanism for guiding said complementary wedge;
    performing a semiconductor encapsulation operation;
    whereby a horizontal movement of said bottom wedge causes said complementary wedge and said bottom platen to move in a substantially vertical direction to clamp said bottom mould and said top mould, wherein a clamping force between said bottom mould and top mould is substantially linearly proportional to a step displacement of said servo motor, said wedge device facilitating a reduction in contamination.

11. The method as recited in claim 10 further comprising the step of placing said semiconductor moulding equipment in a room having a substantially clean-room environment.

12. The method as recited in claim 10 wherein said first and second friction reduction means are caged rollers.

13. The method as recited in claim 10 wherein said wedge device further comprises a load cell for measuring a force which is proportional to said output force.

14. The method as recited in claim 13 wherein said wedge device further comprises a micro-controller communicably connected to said load cell.

15. The method as recited in claim 10 wherein said linear conversion means comprises a planetary screw and a nut.

16. A method of facilitating a contamination-reduced semiconductor packaging operation on a semiconductor device comprising:
    providing a semiconductor moulding equipment having a top and bottom moulds in between top and bottom platens;
    placing the semiconductor device on the bottom mould;
    exerting a clamping force onto said bottom platen using a wedge device, said wedge device comprising,
       a servo motor;
       a linear-conversion mechanism mechanically coupled to said motor for converting a rotational movement to a linear movement;
       a bottom wedge firmly attached to said linear-conversion mechanism, said wedge having a top, a bottom, a wide end and a narrow end;
       a base located below said bottom wedge;
       first rollers disposed between said bottom wedge and said base;
       second rollers disposed on top of said bottom wedge;
       a complementary wedge disposed on top of said second rollers, said complementary wedge being disposed under said bottom platen;

a guide mechanism for guiding said complementary wedge;

performing a semiconductor encapsulation operation;

whereby a horizontal movement of said bottom wedge causes said complementary wedge and said bottom platen to move in a substantially vertical direction to clamp said bottom mould and said top mould, wherein the clamping force between said bottom mould and top mould is substantially linearly proportional to a step displacement of said servo motor, said wedge device facilitating a reduction in contamination.

17. The method as recited in claim 16 further comprising the step of placing said semiconductor moulding equipment in a room having a substantially clean-room environment.

18. The method as recited in claim 16 wherein said wedge device further comprises a load cell for measuring a force which is proportional to said clamping force.

* * * * *